United States Patent
Chou et al.

(10) Patent No.: US 10,074,612 B2
(45) Date of Patent: *Sep. 11, 2018

(54) METHOD FOR FORMING ALIGNMENT MARKS AND STRUCTURE OF SAME

(71) Applicant: Taiwan Semiconductor Manufacturing Company, Ltd., Hsinchu (TW)

(72) Inventors: Cheng-Hsien Chou, Tainan (TW); Sheng-Chau Chen, Tainan (TW); Chun-Wei Chang, Tainan (TW); Kai-Chun Hsu, Yonghe (TW); Chih-Yu Lai, Tainan (TW); Wei-Cheng Hsu, Kaohsiung (TW); Hsiao-Hui Tseng, Tainan (TW); Shih Pei Chou, Tainan (TW); Shyh-Fann Ting, Tainan (TW); Tzu-Hsuan Hsu, Kaohsiung (TW); Ching-Chun Wang, Tainan (TW); Yeur-Luen Tu, Taichung (TW); Dun-Nian Yaung, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/477,971

(22) Filed: Apr. 3, 2017

(65) Prior Publication Data

US 2017/0207176 A1    Jul. 20, 2017

Related U.S. Application Data

(60) Continuation of application No. 15/165,834, filed on May 26, 2016, now Pat. No. 9,627,326, which is a
(Continued)

(51) Int. Cl.
*H01L 21/78* (2006.01)
*H01L 23/544* (2006.01)
(Continued)

(52) U.S. Cl.
CPC ...... *H01L 23/544* (2013.01); *H01L 21/02164* (2013.01); *H01L 21/02233* (2013.01);
(Continued)

(58) Field of Classification Search
None
See application file for complete search history.

(56) References Cited

U.S. PATENT DOCUMENTS 5,837,404 A    11/1998   Lu
6,440,816 B1   8/2002    Farrow et al.
(Continued)

*Primary Examiner* — Asok K Sarkar
(74) *Attorney, Agent, or Firm* — Slater Matsil, LLP

(57) ABSTRACT

A method of fabrication of alignment marks for a non-STI CMOS image sensor is introduced. In some embodiments, zero layer alignment marks and active are alignment marks may be simultaneously formed on a wafer. A substrate of the wafer may be patterned to form one or more recesses in the substrate. The recesses may be filled with a dielectric material using, for example, a field oxidation method and/or suitable deposition methods. Structures formed by the above process may correspond to elements of the zero layer alignment marks and/or to elements the active area alignment marks.

20 Claims, 5 Drawing Sheets

Related U.S. Application Data division of application No. 14/203,242, filed on Mar. 10, 2014, now Pat. No. 9,355,964.

(51) Int. Cl.
*H01L 21/762* (2006.01)
*H01L 29/06* (2006.01)
*H01L 21/308* (2006.01)
*H01L 21/02* (2006.01)
*H01L 27/146* (2006.01)

(52) U.S. Cl.
CPC ........ *H01L 21/308* (2013.01); *H01L 21/7621* (2013.01); *H01L 21/76224* (2013.01); *H01L 27/1463* (2013.01); *H01L 27/14632* (2013.01); *H01L 27/14687* (2013.01); *H01L 29/0649* (2013.01); *H01L 2223/5446* (2013.01); *H01L 2223/54426* (2013.01)

(56) References Cited

U.S. PATENT DOCUMENTS

| | | |
|---|---|---|
| 6,555,925 B1 | 4/2003 | Higashi et al. |
| 7,751,047 B2 | 7/2010 | Bijnen et al. |
| 9,355,964 B2 * | 5/2016 | Chou ................... H01L 23/544 |
| 2003/0199131 A1 | 10/2003 | Fujimoto |
| 2005/0070068 A1 | 3/2005 | Kobayashi |
| 2007/0108638 A1 | 5/2007 | Lane et al. |
| 2007/0176305 A1 | 8/2007 | Sasaki |
| 2010/0270655 A1 | 10/2010 | Scheucher et al. |
| 2011/0076830 A1 | 3/2011 | Nogami et al. |
| 2013/0075938 A1 | 3/2013 | Yang et al. |
| 2014/0312454 A1 | 10/2014 | Chen |
| 2014/0342526 A1 | 11/2014 | Nogami et al. |
| 2015/0206873 A1 | 7/2015 | Chang et al. |

\* cited by examiner

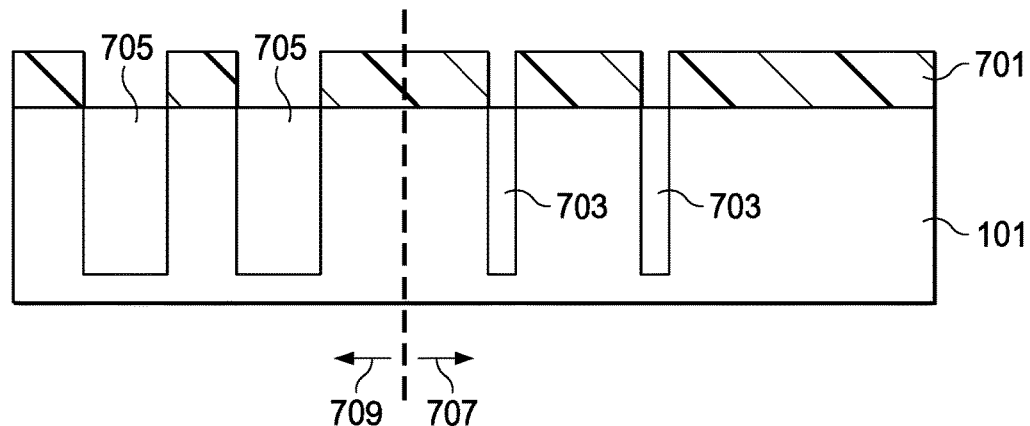
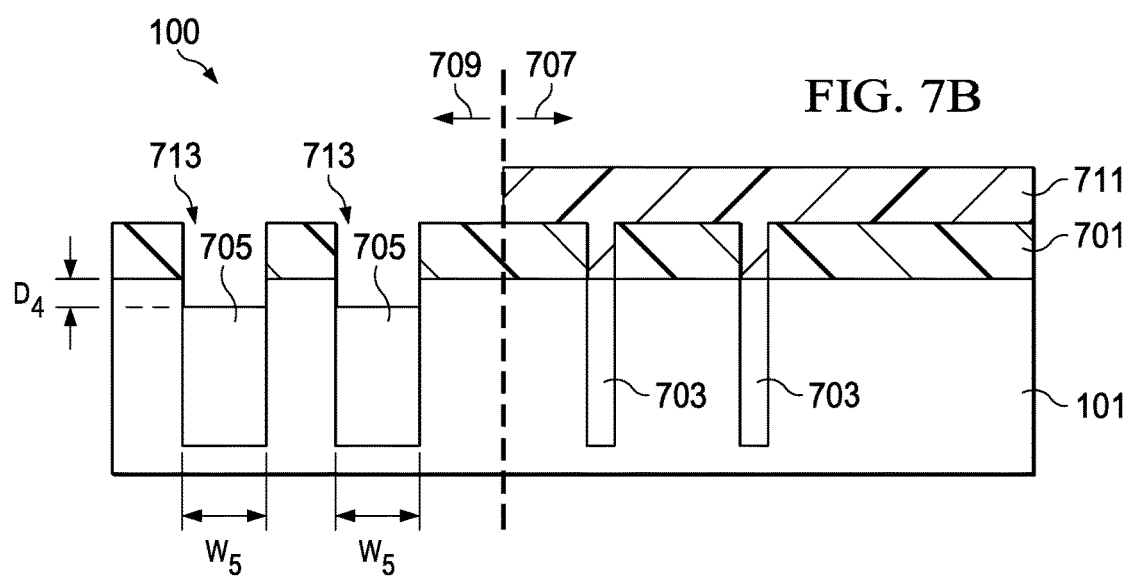

METHOD FOR FORMING ALIGNMENT MARKS AND STRUCTURE OF SAME

PRIORITY CLAIM AND CROSS-REFERENCE

This application is a continuation of U.S. patent application Ser. No. 15/165,834, entitled, "Method for Forming Alignment Marks and Structure of Same," filed May 26, 2016, which is a divisional of U.S. patent application Ser. No. 14/203,242, entitled "Method for Forming Alignment Marks and Structure of Same," filed on Mar. 10, 2014 (now U.S. Pat. No. 9,355,964, issued May 31, 2016), which applications are hereby incorporated herein by reference.

BACKGROUND

Semiconductor manufacturers routinely fabricate multi-layer semiconductor structures to achieve a high level of integration. The semiconductor structures have multiple devices, such as transistors formed in a substrate. Multiple metallization layers are formed over the substrate to electrically interconnect the devices and form functional circuits. The Metallization layers may also include other devices, such capacitors and resistors.

Alignment marks are used to align the wafer such that subsequent layers are formed at the correct location relative to underlying features. For example, alignment marks are used to form the vias and conductive lines in the metallization layers in the correct location to make electrical contact to the devices, such as transistors, formed in the underlying substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-7B are cross-sectional views illustrating a method of forming alignment marks in accordance with some embodiments.

DETAILED DESCRIPTION

Figure 1:
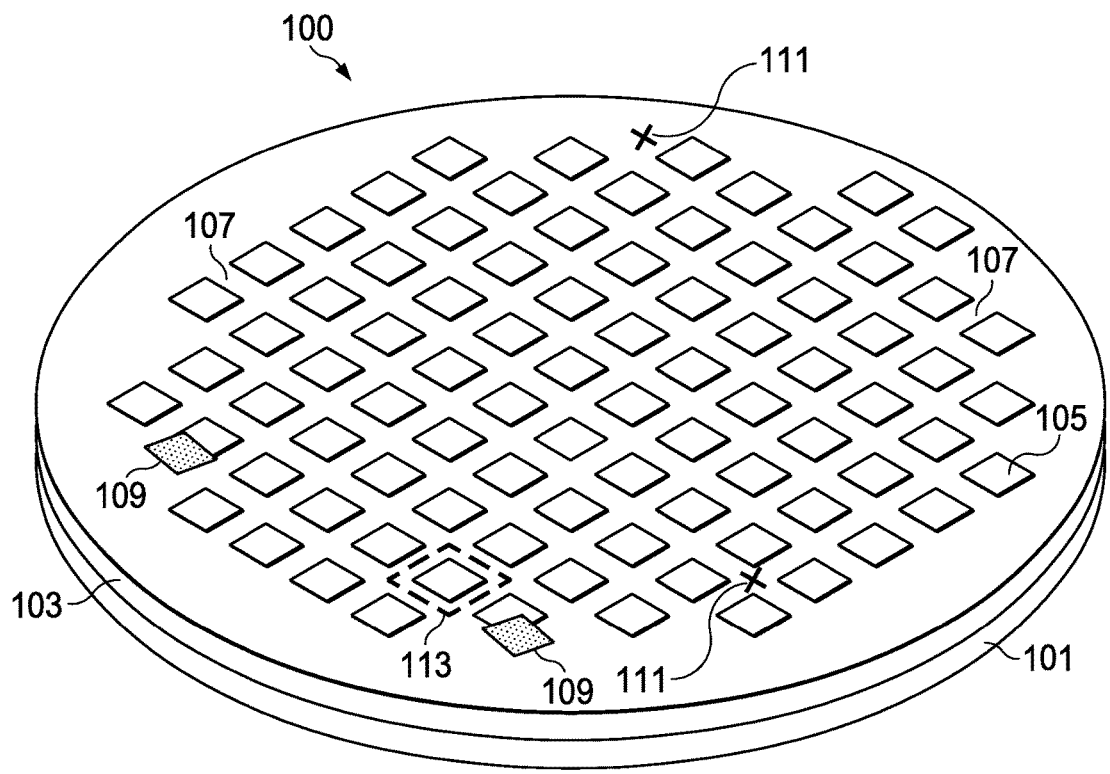
FIG. 1 is a perspective view illustrating a method of forming alignment marks in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is presented in terms of a method of forming semiconductor integrated circuits, in particular, a method of forming alignment marks during fabrication process of the integrated circuits to provide accurate alignment of structures on a wafer between fabrication steps. Embodiments presented below, for example, may describe formation of alignment marks for an image sensor formed without using a shallow trench isolation (STI) process. In some embodiments, zero layer alignment marks and active area alignment marks may be used to aid in the fabrication process. The zero layer alignment marks are usually formed on a wafer before any other process steps. The zero alignment marks have relatively large size and provide a global alignment between subsequently formed layers. However, the zero layer alignment marks may not be sufficient to provide adequate alignment precision required to form features at a die level. The active area alignment marks may be formed on the wafer at the proximity of the die to provide precise alignment at the die level. The active area alignment marks are smaller than the zero layer alignment marks and may have finer features, which may have sizes similar to ones to be formed in the subsequent process steps. In some embodiments, zero alignment marks may be of a first size and the active area alignment marks may be of a second size, the first size being between about 100 to about 1000 times larger than the second size.

With reference to FIG. 1, there is shown a perspective view of a wafer 100 with an overlying mask layer 103. The wafer 100 will subsequently undergo processing to form one or more dies, wherein the dies may be separated after processing to form individual dies for further packaging. For purposes of illustration, the locations of the dies 105 are illustrated in FIG. 1 as rectangular shapes, although one skilled in the art will realize that these shapes may not physically be visible on the wafer 100. The dies 105 are logically separated by intersecting scribe lines 107, which represent areas between adjacent dies 105 in which the dies may be separated by, for example, sawing. As will be described in detail below, zero layer alignment marks 109, illustrated by gray rectangular shapes, and active area alignment marks 111, illustrated by cross shapes located along perimeters 113 of the dies 105, are formed to allow for better alignment between various processing steps.

The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The mask layer 103 is formed over the wafer 100 and may include one or more layers of a mask material, such as silicon dioxide, undoped silicon glass (USG), silicon oxynitride (SiON), phosphosilicate glass (PSG), silicon nitride (SiN), compounds thereof, composites thereof, combinations thereof, or the like, deposited by any suitable method, such as spin-on, chemical vapor deposition (CVD), and plasma-enhanced CVD (PECVD), or the like. These materials and processes are provided as examples and other materials and processes may be used. As discussed in greater detail below, the mask layer 103 will be patterned to form alignment marks on the substrate 101.

In further reference to FIG. 1, the zero layer alignment marks 109 and the active area alignment marks 111 may be simultaneously formed on the substrate 101. In some embodiments, the zero layer alignment marks 109 may be patterned on the wafer 100 and may overlap with some of the dies 105, on which no devices and circuitry will be formed and will be discarded after singulation process. Each of the dies 105 may also have a corresponding active area alignment mark 111, which may be formed, for example, in the scribe lined 107 along the perimeters 113 of each of the dies 105. The zero layer alignment marks 109 and the active area alignment marks 111 may have variety of patterns, and may be formed using variety of lithography and processing steps.

Figure 2:
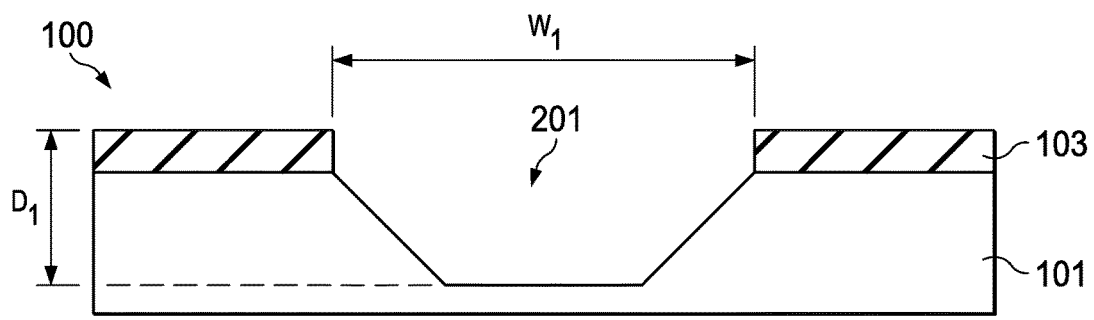

In reference to FIG. 2, a first embodiment is shown in which the mask layer 103 includes a single layer of material. For example, the mask layer 103 may be formed of silicon oxide by a thermal oxidation process or similar process. Photolithography techniques may be used to pattern the mask layer 103 and the substrate 101 to form the zero layer alignment marks 109 and the active area alignment marks 111. Generally, a photoresist layer (not shown) is formed over the mask layer 103 and then exposed to radiation such as ultraviolet light or an excimer laser through a reticle (not shown), in accordance with a desired pattern. A bake or cure operation may be performed, and a developer may be used to remove either the exposed or unexposed portions of the photoresist layer, depending on whether a positive or negative resist is utilized. Thus, a pattern that is used to form openings in the mask layer 103 is formed in the photoresist layer. The specific pattern of the openings, as described herein, is for illustrative purposes only, and other patterns may be formed depending on the design of the wafer 100.

In further reference to FIG. 2, the mask layer 103 and the substrate 101 are etched, for example, by an anisotropic dry etch process to remove exposed portions of the mask layer 103 and the substrate 101. Such etching further forms a first recess 201 in the mask layer 103 and the substrate 101. Multiple etch processes may be utilized to etch through the various layers of the mask layer 103 and the substrate 101. Subsequently, the photoresist layer is removed using, for example, an ashing process in combination with a wet clean process. For example, in an embodiment, the first recess 201 is formed by an anisotropic wet etch process or an anisotropic dry etch process. In an embodiment, the anisotropic wet etch on the substrate 101 may be performed using silicon using potassium hydroxide (KOH), ethylenediamine pyrocatechol (EDP), tetramethylammonium hydroxide (TMAH), or similar. The anisotropic dry etch process may include physical dry etching, chemical dry etching, reactive ion etching, or similar. In an embodiment, the ions that are used in chemical dry etching of silicon are tetrafluoromethane ($CF_4$), sulfur hexafluoride ($SF_6$), nitrogen trifluoride ($NF_3$), chlorine gas ($Cl_2$), or hydrogen bromide (HBr). The typical reactive ion etching gasses for silicon are $CF_4$, $SF_6$ and $HBr+Cl_2$ In the first embodiment, the first recess 201 corresponds to an individual one of the zero layer alignment marks 109 and/or the active area alignment marks 111 on the substrate 101. Shape and number of recesses in the substrate 101 are for illustrative purposes only and may vary according to design specifications for the zero layer alignment marks 109 and the active area alignment marks 111. For example, the first recess 201 may have a different size depending to which alignment mark it corresponds, a zero layer alignment marks or an active area alignment mark. In some embodiments, the first recess 201, which correspond to the zero layer alignment marks 109, may be formed to a first width $W_1$ between about 1 mm and about 50 mm, and a first depth $D_1$ between about 100 Å and about 2000 Å. In other embodiments, the first recess 201, which correspond to the active area alignment marks 111, may be formed to a first width $W_1$ between about 0.5 µm and about 20 µm, and a first depth $D_1$ between about 100 Å and about 2000 Å.

Thereafter, the wafer 100 may undergo further processing, such as forming semiconductor devices, forming dielectric and metallization layers, packaging, and the like. The first recess 201 may be filled during subsequent processing, such as forming an interlayer dielectric (ILD) layer. In particular, the embodiments provided in the present description may be integrated in a manufacturing process for the non-STI image sensor.

Figure 3:
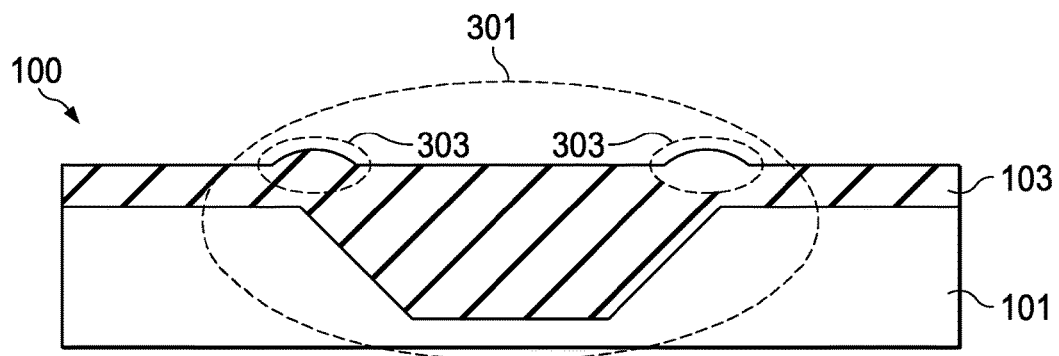

FIG. 3 illustrates a second embodiment in which the first recess 201 illustrated in FIG. 2 is filled using, for example, a field oxidation process. In an embodiment in which the mask layer 103 is formed of a silicon oxide, a field oxidation process may result in bumps 303 being formed along a top surface of the mask layer 103 above the sidewalls of the first recess 201 due to the volume mismatch between the substrate 101 and silicon oxide. In the second embodiment, the first structure 301 corresponds to an individual one of the zero layer alignment marks 109 and/or the active area alignment marks 111 on the substrate 101. The particular shape of the first structure 301 in the substrate 101 are for illustrative purposes only and may vary according to design specifications for the zero layer alignment marks 109 and the active area alignment marks 111.

Figure 4:
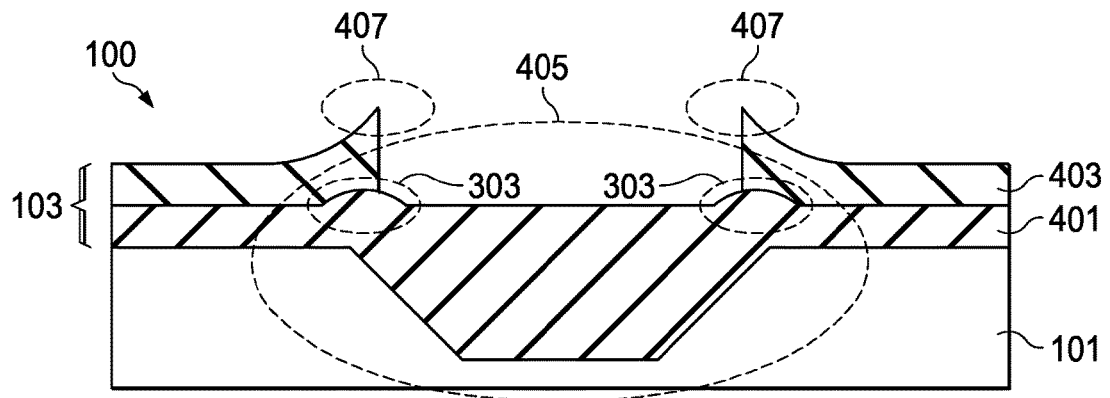

FIG. 4 illustrates a third embodiment in which the mask layer 103 illustrated in FIG. 2 includes multiple layers. For example, FIG. 4 illustrates the mask layer 103 being formed of a first mask layer 401 and a second mask layer 403, although in other embodiments the mask layer 103 may comprise three or more layers. In this embodiment, the etch process to form openings through the mask layer 103 may include multiple etch processes to pattern the various layers of materials.

FIG. 4 further illustrates an embodiment in which the first recess 201 is filled using an oxidation process and the first mask layer 401 is formed of, for example, a silicon oxide. In such an embodiment, bumps 303 may be formed in the first mask layer 401 in a similar manner as discussed above with reference to FIG. 3. Accordingly, a second structure 405 may be formed on the substrate 101 by forming silicon oxide in the first recess 201, for example, by the field oxidation process, or similar. The bumps 303 may form on a surface of the first mask layer 401 near sidewalls of the first recess 201 due to the volume mismatch between the substrate 101 and the material of the first mask layer 401, e.g., silicon oxide. Beaks 407 may also form in the second mask layer 403, e.g., SiN due to the bumps 303 in the first mask layer 401. Subsequently, the second mask layer 305 may be removed. In an embodiment in which the second mask layer 305 is formed of a SiN, the second mask layer 305 may be removed by, for example, dipping the wafer 100 in hot phosphoric acid or the like. In the third embodiment, the second structure 405 corresponds to an individual one of the zero layer alignment marks 109 and/or the active area alignment marks 111 on the substrate 101. The particular shape of the second structure 405 in the substrate 101 are for illustrative purposes only and may vary according to design specifications for the zero layer alignment marks 109 and the active area alignment marks 111.

Figure 5:
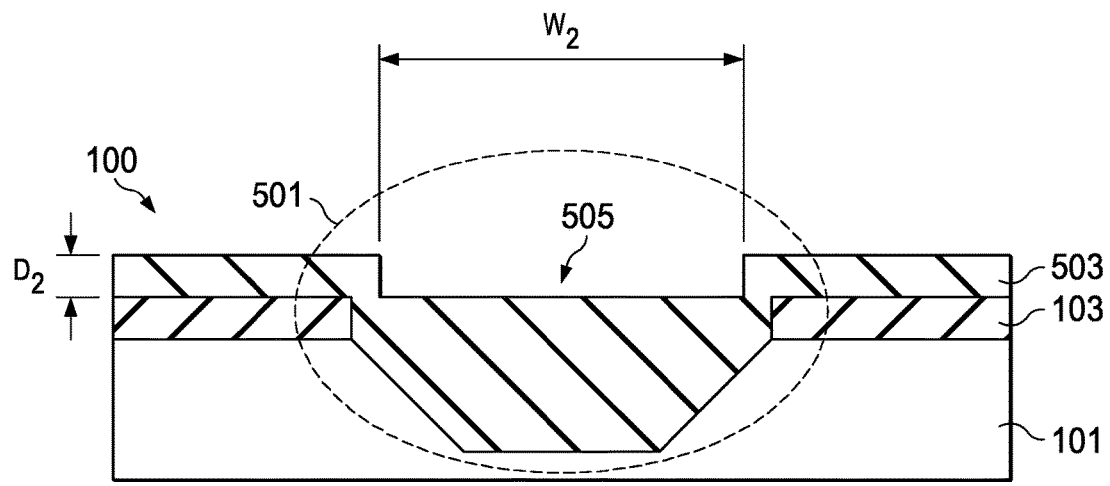

FIG. 5 illustrates a fourth embodiment in which a third structure 501 may be formed on the substrate 101 by depositing a dielectric material 503 in the recess 201 as shown in FIG. 2. In an embodiment, the dielectric material 503 is formed using, for example, a high aspect ratio process (HARP), or similar. In some embodiment, the dielectric material 503 may comprise silicon oxide, or similar. In some embodiments, a second recess 505, which corresponds to the zero layer alignment marks 109, may be formed to a second width $W_2$ between about 0.5 μm and about 20 μm, and a second depth $D_2$ between about 100 Å and about 2000 Å. In other embodiments, the second recess 505, which corresponds to the active area alignment marks 111, may be formed to a second width $W_2$ between about 0.5 μm and about 20 μm, and a second depth $D_2$ between about 100 Å and about 1000 Å.

A single mask layer is illustrated for illustrative purposes only, and other embodiments may use multiple mask layers. For example, the mask layer 103 may be a two-layer mask as shown with reference to FIG. 3, such as a silicon oxide layer and a silicon nitride layer. Due to the different methods of filling the first recess 201, e.g., a thermal oxidation process in FIG. 4 and a deposition process in FIG. 5, an embodiment using multiple mask layers with a deposition method as used in FIG. 5 may not result in the beaks 407 illustrated in FIG. 4.

In the fourth embodiment, the third structure 501 corresponds to an individual one of the zero layer alignment marks 109 and/or the active area alignment marks 111 on the substrate 101. The particular shape of the third structure 501 in the substrate 101 are for illustrative purposes only and may vary according to design specifications for the zero layer alignment marks 109 and the active area alignment marks 111.

Figure 6:
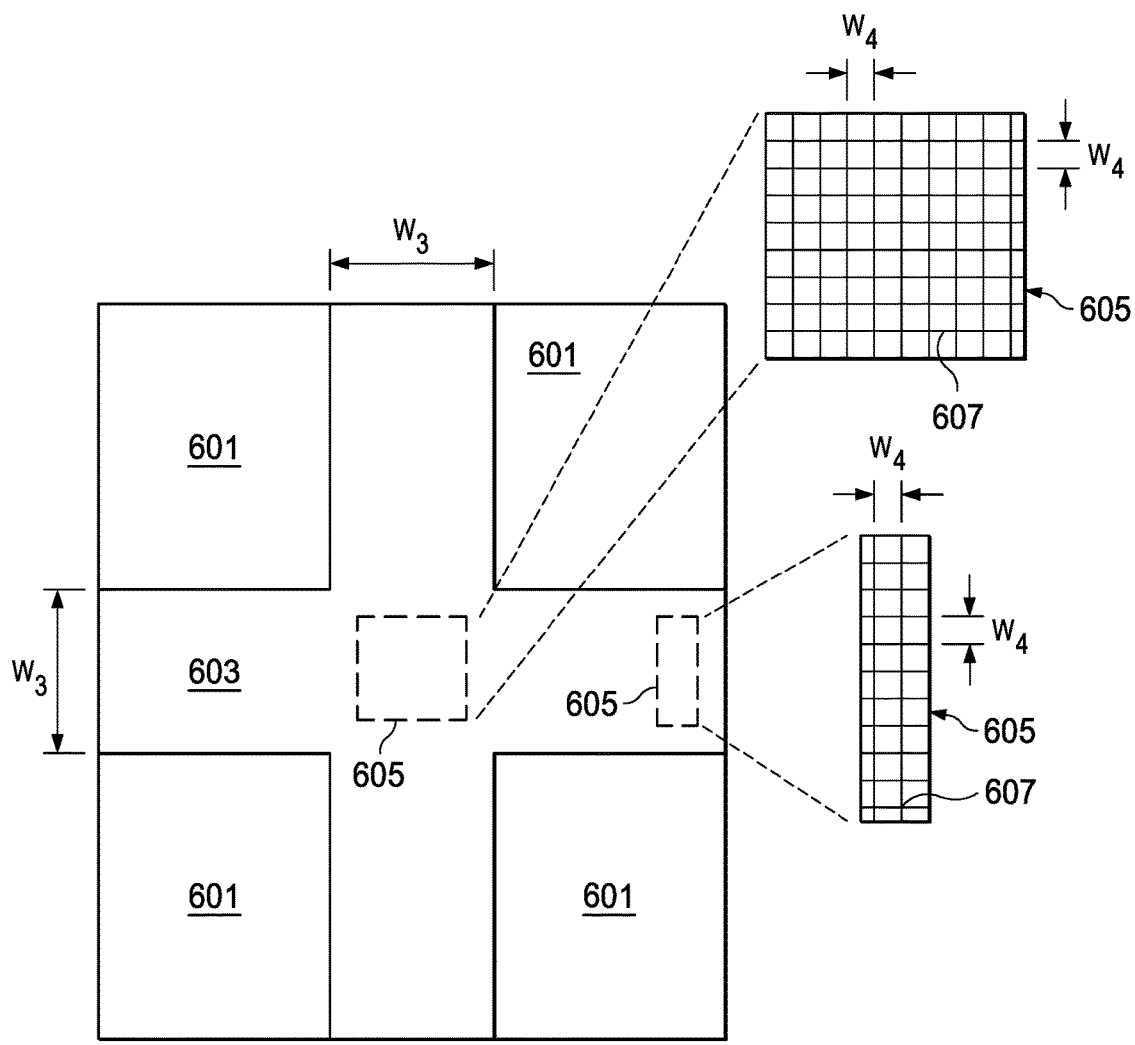

In reference to FIG. 6, in a fifth embodiment, shallow trench isolation (STI) regions 601 may be formed in the scribe lines 107 (see FIG. 1). The STI regions 601 may comprise silicon oxide, silicon nitride, fluoride-doped silicate glass (FSG), or a low-K dielectric material, may also be used. In some embodiments, the STI regions 601 may be formed using a high-density-plasma (HDP) CVD process, using silane ($SiH_4$) and oxygen ($O_2$) as reacting precursors. In other embodiments, the STI regions 601 may be formed using a sub-atmospheric CVD (SACVD) process or high aspect-ratio process (HARP), wherein process gases may comprise tetraethylorthosilicate (TEOS) and ozone ($O_3$). In yet other embodiments, the STI regions 601 may be formed using a spin-on-dielectric (SOD) process, such as hydrogen silsesquioxane (HSQ) or methyl silsesquioxane (MSQ). Other processes and materials may also be used.

In further reference to FIG. 6, the active area alignment marks 111 (see FIG. 1) may be formed between the adjacent STI regions 601 in the scribe lines 107. For example, FIG. 6 illustrates STI regions 601, which may be formed in the scribe lines 107. Between adjacent ones of the STI regions 601 is an alignment mark region 603, which may have a third width $W_3$ of about 10 μm. Active area alignment marks 111 formed within this region may allow for finer positional adjustments between various processing steps and may be, for example, alignment marks such as those discussed above with reference to FIGS. 1-5.

In an embodiment, the active area alignment marks 111 formed in the alignment mark region 603 form a pattern, such as intersecting trenches. For example, elements 605 of FIG. 6 illustrate square-grid patterns of trenches 607, wherein the trenches 607 may be, for example, trenches illustrated in FIGS. 1-5, or a combination thereof. In some embodiments, a pitch $W_4$ of the square-grid patterns may be between about 0.2 μm and about 1 μm.

FIGS. 7A-7B illustrate a sixth embodiment in which the zero layer alignment marks 109 and/or the active area alignment marks 111 are formed while fabricating a non-STI CMOS image sensor. A first patterned mask 701 is formed over the substrate 101 having a pixel region 707 and a frame cell region 709. As will be discussed in greater detail below, the exposed portions of the substrate 101 will be doped, and the exposed portions of the substrate 101 in the frame cell region 709 will be recessed to be utilized as alignment marks. In embodiments not utilizing STI processes during semiconductor device fabrication, doped regions of the substrate may serve the same function as STI regions and may isolate different active areas on the substrate 101 from each other.

In an embodiment, the first patterned mask 701 may be a patterned photoresist layer, a hard mask, or a combination thereof. Subsequently, the exposed portions of the substrate 101 are doped to form a first plurality of doped isolation wells 703 in a pixel region 707 of the substrate 101 to electrically isolate photosensitive pixels (not shown) in the substrate 101, and a second plurality of doped isolation wells 705 in a frame cell region of 709 of the substrate 101, which are subsequently used to form alignment marks. In some embodiments, the first plurality of doped isolation wells 703 and the second plurality of doped isolation wells 705 are formed using ion implantation. For example, the substrate 101 may comprise N-doped silicon, and the first plurality of doped isolation wells 703 and the second plurality of doped isolation wells 705 may be formed by implanting boron or other suitable ions.

In reference to FIG. 7B, a second patterned mask 711 is formed over the first patterned mask 701 and exposed portion of the substrate 101 in the pixel region 707. In an embodiment, the first patterned mask 701 is formed of a negative photoresist and the second patterned mask 711 is formed of a positive photoresist. By using different types of photoresist, e.g., negative and positive photoresist, the first patterned mask 701, e.g., the negative photoresist, remains during the exposure and development of the second patterned mask 711, e.g., the positive photoresist.

In further reference to FIG. 7B, the second plurality of doped isolation wells 705 in the frame cell region 709 of the substrate 101 are subsequently recessed to form recesses 713, while the second patterned mask 711 protects the first plurality of doped isolation wells 703. The recesses 713 may be formed using an anisotropic wet or dry etch process. The recesses 713 form elements of the zero layer alignment marks 109 and/or the active area alignment marks 111. Subsequently, the first patterned mask 701 and the second patterned mask 711 are removed using, for example, an ashing process in combination with a wet clean process. In some embodiments, the recesses 713, which correspond to the zero layer alignment marks 109, are formed to a fifth width $W_5$ between about 0.5 μm and about 20 μm, and a fourth depth $D_4$ between about 100 Å and about 2000 Å. In other embodiments, the recesses 713, which correspond to the active area alignment marks 111, are formed to a fifth width $W_5$ between about 0.5 μm and about 20 μm, and a fourth depth $D_4$ between about 100 Å and about 2000 Å.

Figure 8:
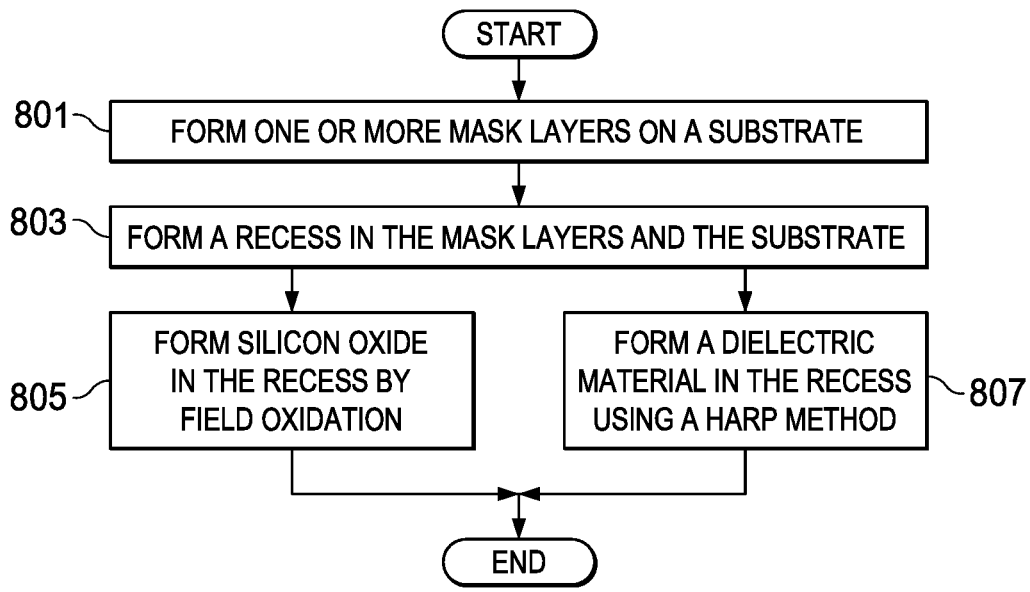
FIGS. 8 and 9 are flowcharts illustrating methods of forming alignment marks in accordance with some embodiments.

FIG. 8 is a flowchart illustrating a method of forming alignment marks in accordance with some embodiments. The method begins at step 801, wherein one or more mask layers are formed over a substrate as illustrated in FIG. 2. In step 803, a recess is formed in the substrate as illustrated in FIG. 2. In further reference to FIGS. 3 and 4, in step 805, silicon oxide is formed in the recess by field oxidation. Alternatively, in step 807, a dielectric material is formed in the recess using, for example, a HAPRP method as illustrated in FIGS. 5 and 6.

Figure 9:
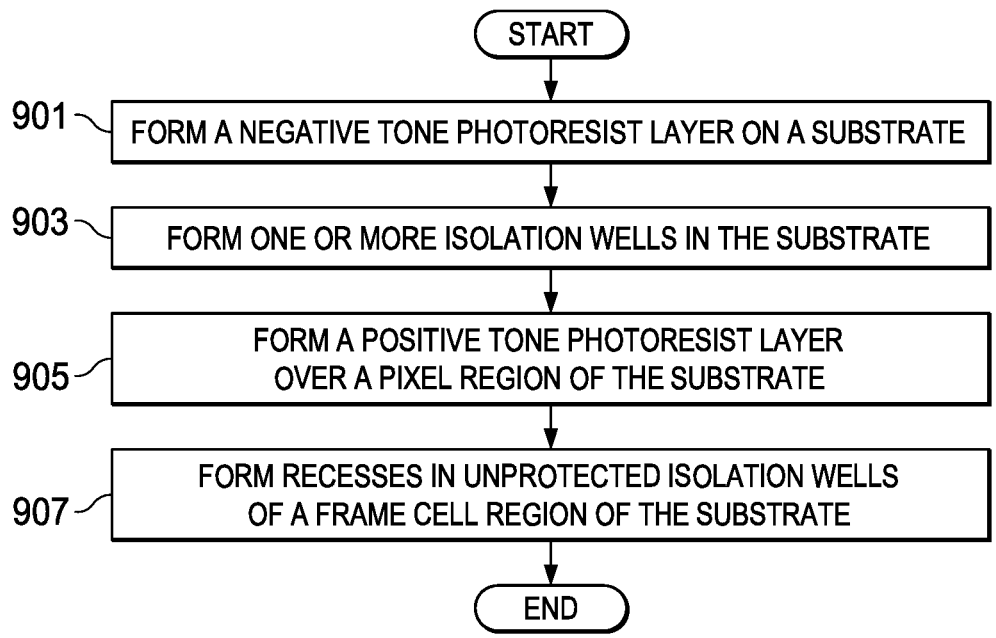

FIG. 9 is a flowchart illustrating a method of forming alignment marks in accordance with some embodiments. The method begins at step 901, wherein a negative tone photoresist layer is formed over a substrate as illustrated in FIG. 7A. In step 903, a one or more isolation wells are formed in the substrate to electrically isolate photosensitive pixels in the substrate as illustrated in FIG. 7A. In reference to FIG. 7B, in step 905, a positive tone photoresist layer is formed over a pixel region of the substrate to protect the pixel region from further processing steps. Finally, in step 907, recesses are formed in unprotected isolation wells in a frame cell region of the substrate as illustrated in FIG. 7B.

In an embodiment, a method for forming alignment marks, the method comprises providing a substrate, forming one or more zero layer alignment marks of a first size, and simultaneously with the forming the one or more zero layer alignment marks, forming one or more active area alignment marks of a second size, the second size being less than the first size.

In another embodiment, a method for forming alignment marks, the method comprises providing a substrate, forming a first plurality of doped regions in a pixel region of the substrate, forming a second plurality of doped regions in a frame cell region the substrate, and recessing the second plurality of doped regions, thereby forming a plurality of alignment marks.

In yet another embodiment, a method for forming alignment marks, the method comprises forming a plurality of pixel regions on a substrate, the plurality of pixel regions being a non-shallow trench isolation (non-STI) design, forming one or more first alignment marks on the substrate, the one or more first alignment marks having a first size, and forming one or more second alignment marks on the substrate, the one or more second alignment marks having a second size, the second size being less than the first size.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
patterning a semiconductor substrate using a first mask layer to form a first plurality of recesses, each of the first plurality of recesses being a first width measured in a first direction, the first direction being parallel to a major surface of the semiconductor substrate;
patterning the semiconductor substrate using a second mask layer to form a second plurality of recesses, each of the second plurality of recesses being a second width in the first direction, the second width being less than the first width;
oxidizing the semiconductor substrate and the first mask layer and the second mask layer to fill the first plurality and the second plurality of recesses with a dielectric material, the dielectric filled first plurality of recesses forming a first plurality of alignment marks, the dielectric filled second plurality of recesses forming a second plurality of alignment marks, a top surface of the dielectric material having bumps overlying sidewalls of the first plurality and the second plurality of recesses; and
forming semiconductor structures on the semiconductor substrate using the first plurality of alignment marks and the second plurality of alignment marks to align the semiconductor structures.

2. The method of claim 1, wherein the second plurality of alignment marks have a square-grid pattern, the square-grid pattern having a pitch between about 0.2 μm and about 1 μm.

3. The method of claim 1, wherein the first width is between about 100 to about 1000 times larger than the second width.

4. The method of claim 1, wherein the first plurality of alignment marks are zero layer alignment marks, and wherein the second plurality of alignment marks are active area alignment marks.

5. The method of claim 1, wherein the second plurality of alignment marks are formed in scribe lines separating individual dies on the semiconductor substrate.

6. The method of claim 1, wherein the second plurality of alignment marks are formed between adjacent shallow trench isolation (STI) regions, the second plurality of alignment marks having a square-grid pattern.

7. The method of claim 1, wherein the semiconductor substrate has a pixel region and a frame cell region, and the second plurality of alignment marks are formed in the frame cell region.

8. The method of claim 1, wherein the first plurality of alignment marks and the second plurality of alignment marks are simultaneously formed on the semiconductor substrate.

9. A method comprising:
patterning a substrate to form a first plurality of recesses, each of the first plurality of recesses being a first width measured in a first direction, the first direction being parallel to a major surface of the substrate;
patterning the substrate using to form a second plurality of recesses, each of the second plurality of recesses being a second width in the first direction; and
depositing a dielectric material in the first plurality and the second plurality of recesses with using a high aspect ratio process to form a first plurality alignment marks and a second plurality of alignment marks, respectively, a top surface of the dielectric material forming a third plurality of recesses overlying the first plurality of recesses and a fourth plurality of recesses overlying the second plurality of recesses, each of the third plurality of recesses being a third width in the first direction, each of the fourth plurality of recesses being a fourth width in the first direction, the third width being less than the first width, and the fourth width being less than the second width.

10. The method of claim 9, wherein the second plurality of alignment marks have a square-grid pattern, the square-grid pattern having a pitch between about 0.2 µm and about 1 µm.

11. The method of claim 9, wherein the first plurality of alignment marks are zero layer alignment marks.

12. The method of claim 9, wherein the second plurality of alignment marks are active area alignment marks.

13. The method of claim 9, wherein the second plurality of alignment marks are formed in scribe lines separating individual dies on the substrate.

14. The method of claim 9, wherein the fourth plurality of recesses each have width between about 0.5 µm and about 20 µm.

15. A method comprising:
   patterning a substrate to form a first plurality of alignment marks, each of the first plurality of alignment marks being a first width measured in a first direction, the first direction being parallel to a major surface of the substrate; and
   simultaneously with patterning the substrate to form a first plurality of alignment marks, patterning the substrate using to form a second plurality of alignment marks, each of the second plurality of alignment marks being a second width in the first direction, the second width being less than the first width.

16. The method of claim 15, further comprising:
   forming a dielectric material in the first plurality of alignment marks and the second plurality of alignment marks.

17. The method of claim 15, wherein the first plurality of alignment marks are zero layer alignment marks, and wherein the second plurality of alignment marks are active area alignment marks.

18. The method of claim 15, wherein the substrate has a pixel region and a frame cell region, and the second plurality of alignment marks are formed in the frame cell region.

19. The method of claim 15, wherein the substrate has a plurality of die regions separated by scribe lines, at least one the first plurality of alignment marks overlap with at least one die region, the second plurality of alignment marks being within the scribe lines.

20. The method of claim 15, wherein the first width is between about 100 to about 1000 times larger than the second width.

* * * * *